United States Patent
Adam

(10) Patent No.: US 7,579,618 B2
(45) Date of Patent: Aug. 25, 2009

(54) CARBON NANOTUBE RESONATOR TRANSISTOR AND METHOD OF MAKING SAME

(75) Inventor: John Douglas Adam, Millersville, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 447 days.

(21) Appl. No.: 11/068,750

(22) Filed: Mar. 2, 2005

(65) Prior Publication Data

US 2006/0197076 A1    Sep. 7, 2006

(51) Int. Cl.
*H01L 31/00* (2006.01)

(52) U.S. Cl. .............................. 257/25; 257/12; 257/20; 257/22; 257/24; 257/E29.07; 257/E29.297; 257/E51.04; 977/732; 977/742; 977/762

(58) Field of Classification Search ................ 977/742, 977/732, 762; 257/12, 22, 20, 24, 25, E29.07, 257/E29.297, E51.04
See application file for complete search history.

(56) References Cited

U.S. PATENT DOCUMENTS

| | | | |
|---|---|---|---|
| 4,979,149 A | | 12/1990 | Popovic et al. |
| 5,264,736 A | * | 11/1993 | Jacobson ................ 327/365 |
| 2002/0024099 A1 | * | 2/2002 | Watanabe et al. ........... 257/368 |
| 2002/0163079 A1 | * | 11/2002 | Awano .................... 257/750 |
| 2004/0152272 A1 | * | 8/2004 | Fladre et al. ............... 438/284 |
| 2005/0212014 A1 | * | 9/2005 | Horibe et al. .............. 257/213 |

FOREIGN PATENT DOCUMENTS

| | | |
|---|---|---|
| EP | 0259614 A1 | 3/1988 |
| GB | 2382718 A | 6/2003 |
| WO | 01/03208 A1 | 1/2001 |
| WO | 02/080360 A1 | 10/2002 |
| WO | 2004/088719 A2 | 10/2004 |
| WO | 2004/108586 A1 | 12/2004 |

OTHER PUBLICATIONS

H.C. Nathanson, et al., "The Resonant Gate Transistor," Mar. 1967, IEEE Trans ED-14, pp. 117-133.*
"Micromechanical Resonators for Oscillators and Filters," C.T.-C. Nguyen, Proc. 1995 IEEE Ultrasonics Symposium, 489-99, Jun. 1995.
"Carbon Nanotube Actuators," R. H. Baughman et al., Science, 284, 1340-4, May, 1999.
"Charge-Induced Anisotropic Distortions of Semiconducting and Metallic Carbon Nanotubes," Y.N. Gartstein et al., Phys. Rev. Lett., 89, Jul. 2002, 045503-1-4.

(Continued)

*Primary Examiner*—Andy Huynh
(74) *Attorney, Agent, or Firm*—Rothwell, Figg, Ernst & Manbeck, P.C.

(57) ABSTRACT

A resonant transistor includes a substrate, a source and a drain formed on the substrate, an input electrode and a carbon nanotube gate. A gap is formed between the source and the drain. The input electrode is formed on the substrate. The carbon nanotube gate is clamped on one end by a contact electrode and positioned, preferably cantilevered, over the gap and over the input electrode.

32 Claims, 5 Drawing Sheets

OTHER PUBLICATIONS

"Single- and multi-wall carbon nanotube field-effect transistors," R. Martel, et al., Applied Physics Letters, 73, 17, pp. 2447-9, Oct. 1998.

"The Resonant Gate Transistor," H.C. Nathanson, et al., IEEE Trans ED-14, 117-133, Mar. 1967.

"Growth of Single-Walled Carbon Nanotubes from Discrete Catalytic Nanoparticles of Various Sizes," Y.M. Li, et al., J. Phys. Chem. B 105, 11424-11431, Oct. 2001.

"High-Q HF Microelectromechanical Filters," Frank D. Bannon, III, et al., IEEE J. Of Solid-State Circuits, 35.4, pp. 512-26, Apr. 2000.

Nathanson, et al., The Resonant Gate Transistor, IEEE Transactions of Electron Devices, Mar. 1967, pp. 117-133, vol. ED-14, No. 3 (XP-001040818).

* cited by examiner

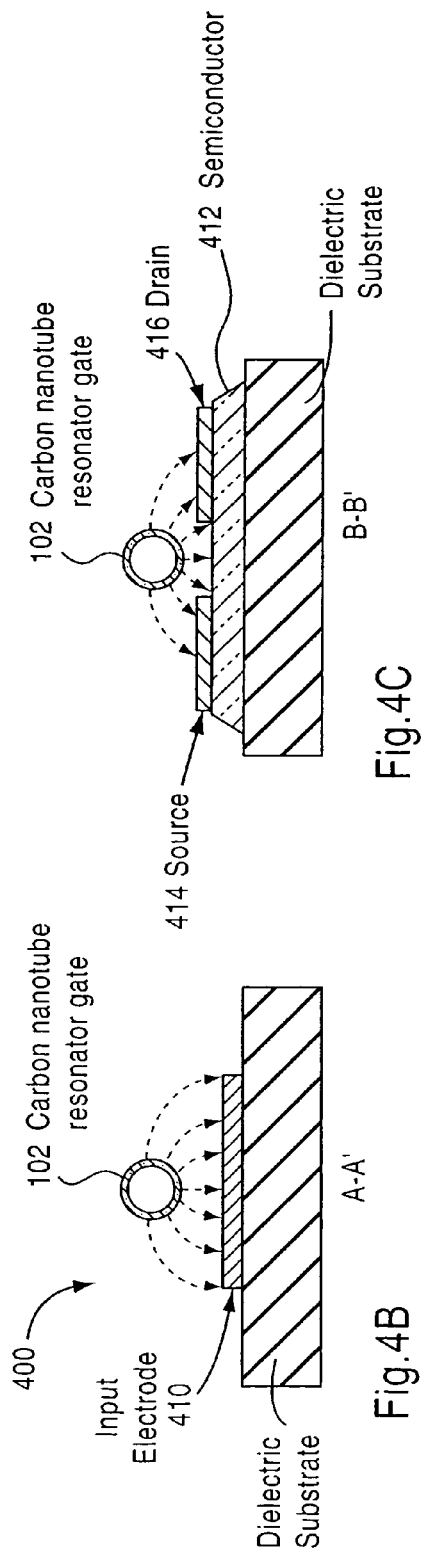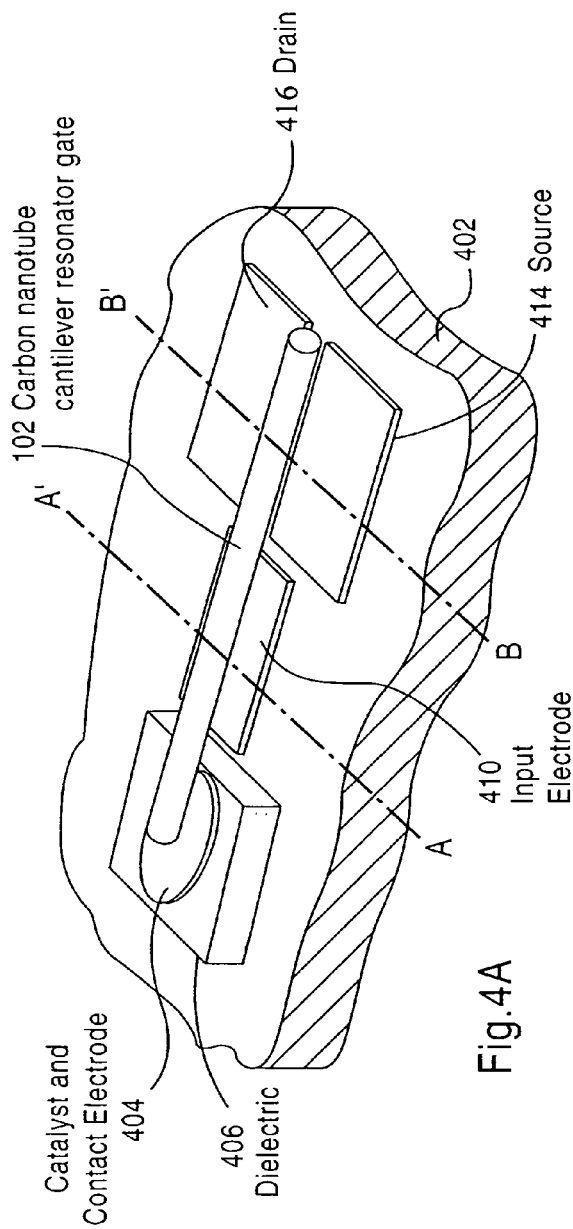

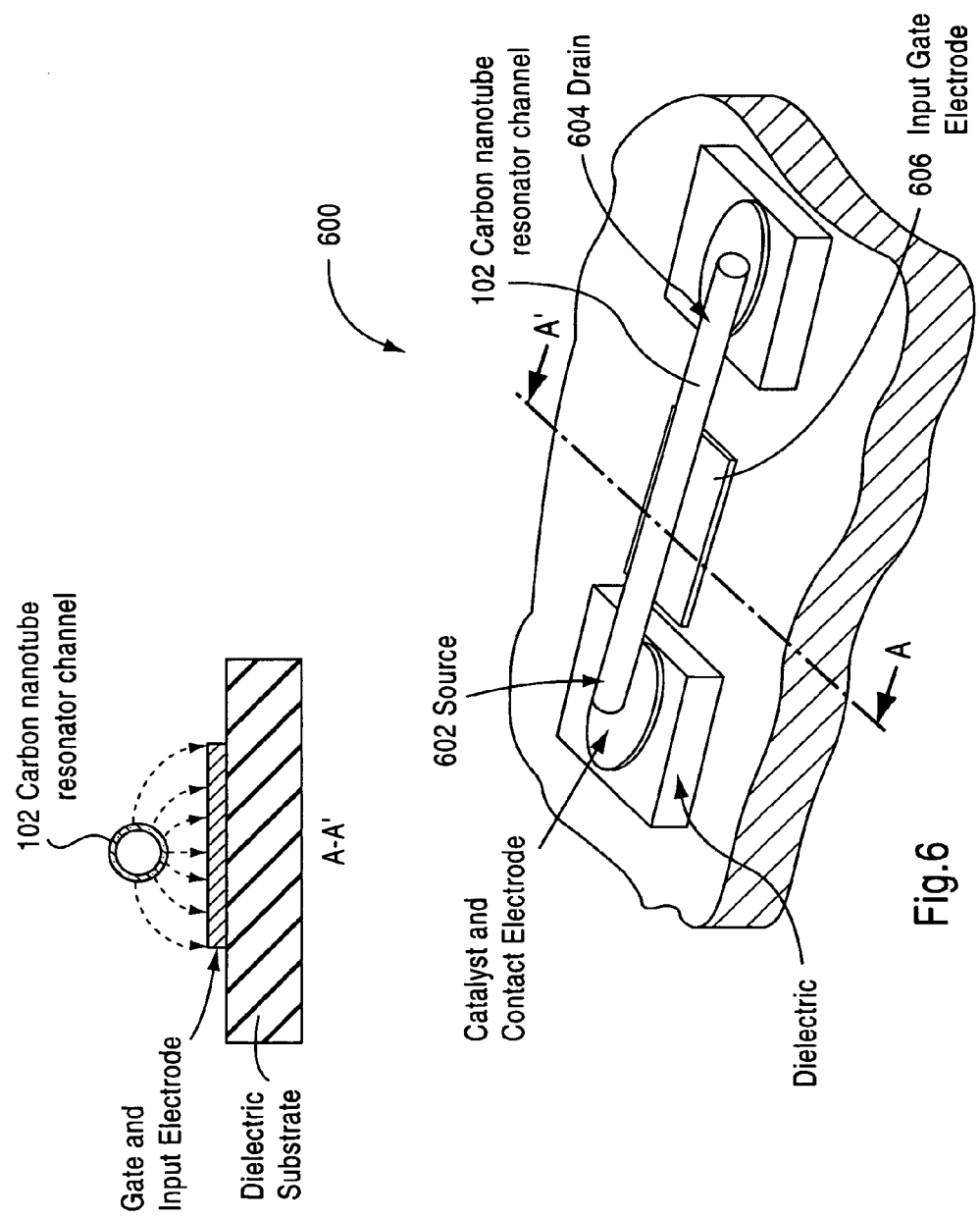

CARBON NANOTUBE RESONATOR TRANSISTOR AND METHOD OF MAKING SAME

GOVERNMENT LICENCE RIGHTS

This invention was made with Government support under contract no. 30011555 awarded by JPL/DARPA. The Government has certain rights in this invention.

BACKGROUND OF THE INVENTION

1. Field of the Invention

The present invention relates to carbon nanotube devices. More particularly, the present invention relates to resonator transistors fabricated from carbon nanotubes.

2. Description of the Related Art

Carbon nanotubes were discovered in the early 1990s as a product of arc-evaporation synthesis of fullerenes. Scientists have since determined that carbon nanotubes have extraordinary physical characteristics, and their potential use in many different applications has attracted much attention. For instance, carbon nanotubes have many attractive properties for high-quality mechanical resonators operating in the high frequency (HF) range through the microwave range.

A simple carbon nanotube resonator is shown in FIG. 1. The "clamped-clamped" resonator 100 includes carbon nanotube (CNT) 102 is clamped on both ends 104a and 104b and is biased by an electrode 106 with a voltage V. The capacitance of the resonator 100 can be represented by:

$$\text{Capacitance} = \frac{2\pi\varepsilon}{\text{LN}\left[h/r + ((h/r)^2 - 1)\right]^{1/2}}$$

where h is the distance between the electrode 106 and the nanotube 102 (i.e., the size of the gap g) and r is the radius of the nanotube 102.

The CNT 102 is actuated by two mechanisms: electrostatic and charge injection.

Electrostatic actuation relates to a force applied normal to the nanotube axis represented by:

Force=½*dC/dh*V²,

Electrostatic actuation is described in detail in "Micromechanical Resonators for Oscillators and Filters," C. T.-C. Nguyen, Proc. 1995 IEEE Ultrasonics Symposium, 489-99, 1995, the entire contents of which are incorporated herein by reference.

Charge injection actuation relates to axial strain, which can be represented by:

δL/L$_t$=δn/10 wherein δn=excess electrons/carbon atom. Motion normal to the tube axis is caused by buckling. Charge injection actuation is described in detail in "Carbon Nanotube Actuators," R. H. Baughman et al., Science, 284, 1340-4, 1999 and "Charge-Induced Anisotropic Distortions of Semiconducting and Metallic Carbon Nanotubes," Y. N. Gartstein et al., Phys. Reb. Lett., 89, July 2002, the contents of each are hereby incorporated by reference.

Both actuation mechanisms rely on the capacitance C between the nanotube 102 and the electrode 106. However, simple analysis reveals that for reasonably sized gaps g, the effective resistance of the nanotube resonator becomes very large.

FIG. 2A shows an LC circuit 200 modeling the resonator 100. In the circuit, the inductance L, the capacitance C and the resistance R can be represented by:

$$L = \frac{m}{\eta^2} \quad C = \frac{\eta^2}{k} \quad R = \frac{(km)^{1/2}}{Q\eta^2}$$

wherein m=effective mass, k=spring constant, η=V*dC/dh, and h is the distance from the electrode 106 to the nanotube 102 (i.e., gap g).

FIG. 2B shows the dynamic resistance of the resonator 100 in relation of the distance from the electrode 106 to the nanotube 102 (h). As shown, with small gaps (h<<radius of nanotube), the resonator 100 will have low dynamic resistance (ohms). However, a carbon nanotube resonator will have very large dynamic resistance when the electrode spacing is significantly greater than the nanotube radius. Therefore, a high impedance buffer amplifier will be needed at the output of the nanomechanical resonator to improve the signal strength available for conventional RF test equipment with 50 Ohm input impedance. The high impedance of the carbon nanotube resonators presents problems in practical devices and massive parallelism is being considered to bring the resistance into a manageable range.

Attempts to incorporate a carbon nanotube into a transistor have been made. FIG. 5A shows a diagram of a FET 500 having a carbon nanotube 502 grown into the channel thereof. FIG. 5B is a graph of its voltage-current characteristics of the transistor 500. This configuration was reported by International Business Machines Corporation and is published at "Single- and multi-wall carbon nanotube field-effect transistors", R. Martel, T. Schmidt, H. R. Shea, T. Hertel and Ph. Avouris, Applied Physics Letters, 73, 17, pp2447-9, 1998, the contents of which are incorporated herein by reference.

This device 500 has the problem that the gate 504 extends over the whole surface beneath the source 506 and drain 508, which causes extremely high impedances. Therefore, the device 500 cannot operate even at moderate frequencies, let alone high frequencies.

In view of the foregoing, there is a need to develop new and improved carbon nanotube resonators and methods for making the same.

SUMMARY OF THE INVENTION

According to an embodiment of the present invention, a resonant transistor is provided which includes a substrate, a source and a drain formed on the substrate, an input electrode and a carbon nanotube gate. A gap is formed between the source and the drain. The input electrode is formed on the substrate. The carbon nanotube gate is clamped on one end by a contact electrode and positioned, preferably cantilevered, over the gap and over the input electrode.

According to an embodiment of the present invention, a resonant transistor is provided which includes a substrate, a source and a drain formed on the substrate, an input gate electrode and a carbon nanotube channel. A gap is formed between the source and the drain. The input gate electrode formed on the substrate. The carbon nanotube channel is positioned over the gap and over the input electrode. The nanotube channel is clamped on a first end by a first contact electrode formed on the source and on a second end by a second contact electrode formed on the drain.

According to an embodiment of the present invention, a resonant transistor is provided which includes a substrate, a source and a drain formed on the substrate, an input electrode and a carbon nanotube gate. A gap is formed between the source and the drain. The carbon nanotube gate is positioned over the gap and over the input electrode and is clamped on first and second ends respectively by first and second contact electrodes.

According to an embodiment of the present invention, a method for fabricating a resonant transistor is provided. The method includes a step of forming a source and a drain on a substrate. The source and drain are adjacent to one another and are separated by a gap. The method includes a step of forming an input electrode on the substrate. Further, a contact electrode is on the substrate, and a carbon nanotube gate is formed on the contact electrode such that the carbon nanotube gate is clamped on one end to the contact electrode and bridges the input electrode and the gap.

According to an embodiment of the present invention, a method for fabricating a resonant transistor is provided. The method includes a step of forming a source and a drain on a substrate with a gap being between the source and the drain. Further, an input gate electrode is on the substrate at least partially within the gap. A carbon nanotube channel is formed over the gap and over the input electrode. The nanotube gate is clamped on a first end by a first contact electrode formed on the source and on a second end by a second contact electrode formed on the drain.

Further applications and advantages of various embodiments of the invention are discussed below with reference to the drawing figures.

BRIEF DESCRIPTION OF THE DRAWINGS

FIGS. 4A-C are diagrams of various views of a carbon nanotube resonate gate transistor according to an embodiment of the present invention;

FIG. 6 is a diagram of a carbon nanotube resonant channel transistor according to an embodiment of the present invention.

DETAILED DESCRIPTION OF THE PREFERRED EMBODIMENTS

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

One of the first micro-electro-mechanical systems (MEMS) devices made was the resonant gate transistor (RGT), which is described in detail in "The Resonant Gate Transistor," H. C. Nathanson, W. E. Newell, R. A. Wickstrom and J. R. Davis, IEEE Trans ED-14, 117-133, 1967, the entire contents of which are hereby incorporated by reference. The resonant gate transistor included a micromechanical tungsten or gold beam resonator that was formed in the gate of a silicon-based field effect transistor (FET). The micromechanical beam resonator gave the FET high-Q bandpass gain characteristics. However, resonant gate transistor could not be used for anything other than low frequency operation, and ultimately fell out of vogue in favor of modern digital electronics.

The present invention integrates a carbon nanotube resonator with a FET to create an integrated buffer amplifier. This integrated carbon nanotube resonator buffer amplifier device has significantly lower output impedance than that of basic carbon nanotube resonators and as a result, is more easily integrated into practical signal processing circuits. Further, the device is capable of operating at frequencies much higher than conventional RGT's.

Two device configurations are herein considered: the resonant gate transistor and the resonant channel transistor.

Carbon Nanotube Resonant Gate Transistor

Figure 1:
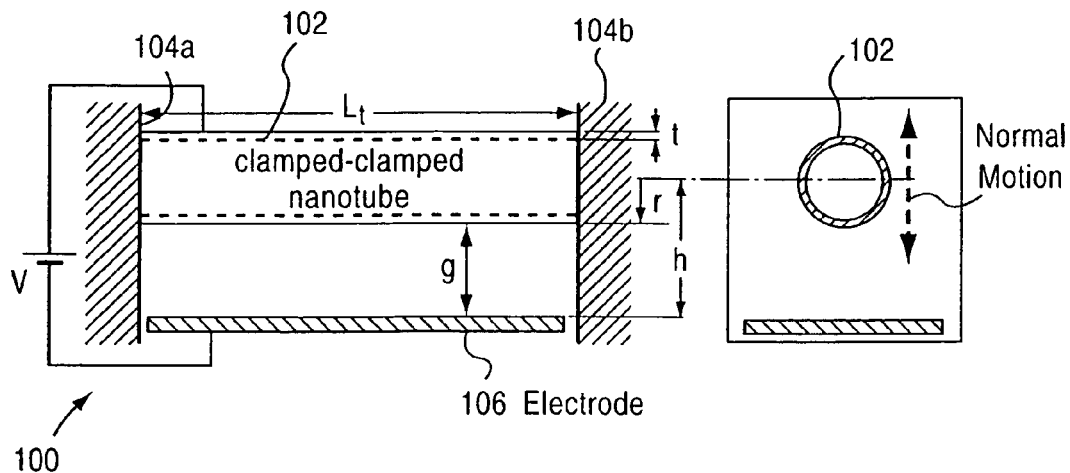
FIG. 1 is a diagram of a simple carbon nanotube resonator.
Figure 2A:
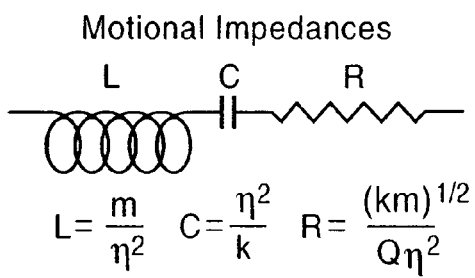
FIGS. 2A-2B respectively show a circuit modeling the resonator of FIG. 1 and a graph representing the dynamic resistance versus electrode spacing for the resonator.
Figure 2B:
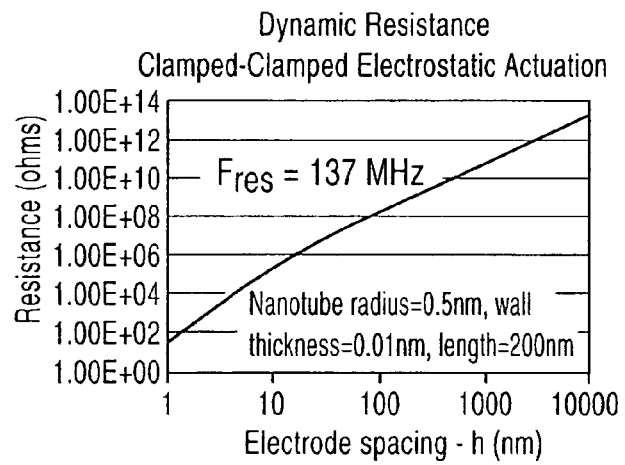
Figure 3:
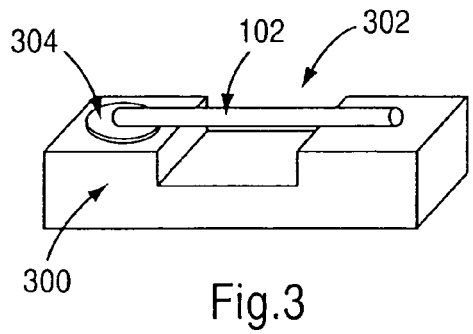
FIG. 3 is diagram of a cantilevered carbon nanotube grown over a trench.
Figures 5A, 5B:
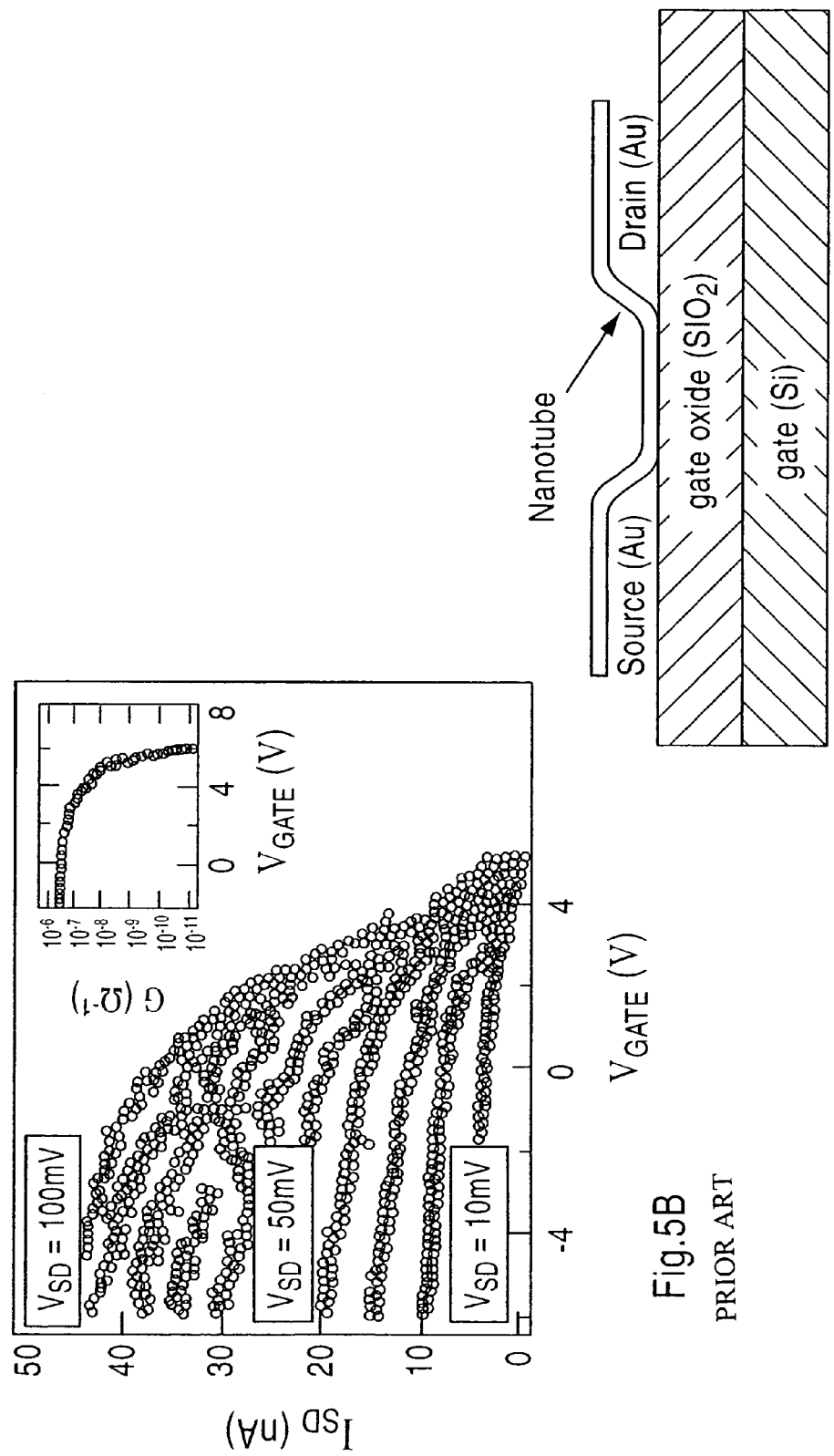
FIG. 5A is a diagram of a prior art carbon nanotube field effect transistor (FET) characteristics.
FIG. 5B is a graph of the current-voltage characteristics of the FET in FIG. 5A.

A single wall carbon nanotube (SWNT) or arrays thereof, may be seeded by a catalyst and grown in a desired direction, parallel to a substrate as shown in FIG. 3. The nanotube 102 can be grown to bridge a trench 302 in a substrate 300 with seed catalyst 304. An exemplary technique is described in "Growth of single-walled carbon nanotubes from discrete catalytic nanoparticles of various sizes," Liu, Y. M.; Kim, W.; Zhang, Y. G.; Rolandi, M.; Wang, D. W.; Dai, H. J., *J. Phys. Chem. B* (2001), 105, 11424-11431, the entire contents of which are incorporated by reference. By this technique, SWNT's can be suspended over an electrode and cantilevered. However, the invention is not meant to be limited to any particular technique for growing SWNT's.

In a Carbon Nanotube RGT according to the present invention, a carbon nanotube is incorporated into the FET and used as the gate of a FET. Referring to FIGS. 4A-C, a carbon nanotube resonant gate transistor is shown. Device 400 included a carbon nanotube 102 grown on a catalyst 404 (on an electrode), on a dielectric layer 406, on a substrate 402. The nanotube 102 is clamped by catalyst/electrode 404 on one end and is cantilevered such that is bridges over an input electrode 410 and a semiconductor layer 412. Transistor source 414 and drain 416 are formed on the semiconductor layer 412, each on opposite sides of the nanotube 102.

A bias voltage and an RF signal voltage are applied to the resonator via electrode 404 and the input electrode 410, thereby causing the nanotube to vibrate at a signal frequency f. This results in a time varying electric field that modulates the current in the FET channel providing impedance transformation between the input electrode 410 and the source-drain output. The variation of the source-drain current of the FET becomes a maximum at the resonant frequency of the nanotube. As a result, device 400 achieves high-Q and gain characteristic.

Utilizing a dielectric substrate 402, in contrast to prior art transistors which use silicon, acts to minimize losses associated with the low conductivity at microwave frequencies. This device configuration is compatible with various silicon-on-insulator (SOI), III-V and wide bandgap SiC and GaN transistor approaches. It should be noted that there may be fabrication limitations due to the high growth temperatures of the carbon nanotubes.

Thus, a carbon nanotube resonant gate transistor may be fabricated which can operate effectively in frequencies in the range of 100 Mhz-100 Ghz.

Carbon Nanotube Resonant Channel Transistor

According to another embodiment of the present invention, a carbon nanotube resonant channel transistor (RCT) is shown in FIG. 6. The device 600 is similar to the device 400 of FIG. 4 except that carbon nanotube 102 clamped onto the transistor source 602 at one end and the transistor drain 604 at the other end of the nanotube 102, bridging an input (gate) electrode 606. When an appropriate DC bias is applied to the nanotube 102, an RF signal applied between the nanotube 102 and the input electrode 606 will cause the nanotube to vibrate at the signal frequency. The time varying electric fields associated with this vibration will modulate the carriers in the nanotube channel, thus causing the source-drain current to vary in synchrony with the nanotube vibration. When the RF input signal matches the resonance frequency of the nanotube, large displacements result in large changes in the source-drain current giving the device a high-Q bandpass gain characteristic. The present invention transforms the resonator impedance to significantly lower value at the source-drain output.

Each of the device configurations of FIG. 4 and FIG. 6 can be applied to both resonant gate and resonant channel transistors.

Resonator Filters

Figure 7:
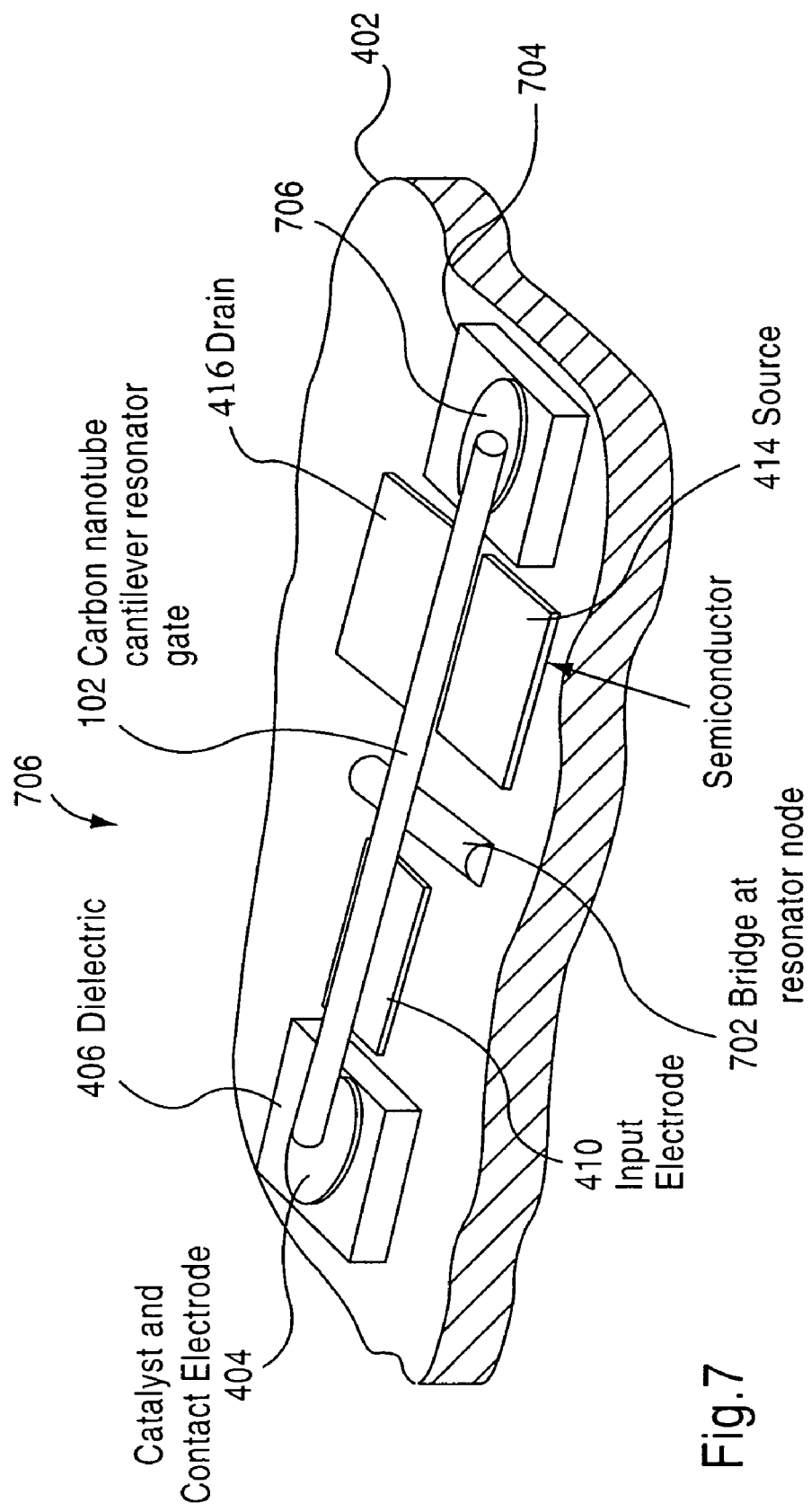
FIG. 7 is a diagram of a two-pole carbon nanotube resonant gate transistor.

The devices above can be modified to achieve multi-pole filter characteristics. According to an embodiment of the present invention, a multi-pole filter is shown in FIG. 7. Device 700 is similar to the device 400 of FIG. 4 but is clamped on both ends of the nanotube 102 and further includes a bridge 702 positioned between two equal lengths of nanotube 102. Accordingly, a second dielectric layer 702 having a catalyst 706 thereon is used to clamp the distal end of the nanotube 102 opposite electrode/catalyst 404.

The bridge 702 provides controlled coupling between two resonator sections of the nanotube 102. As a result, a filter is effected with a pass-band shape that can be controlled. The carbon nanotube 102 is preferably continuous from the clamped ends and over the bridge 702 with the inter-resonator coupling being controlled by the width of the bridge 702.

A number of mechanical filter configurations are described in "High-Q HF Micromechanical Filters", Frank D. Bannon, III, John R. Clark, and Clark T.-C. Nguyen, IEEE J. of Solid State Circuits, 35,4, pp 512-26, 2000, the entire contents of which are hereby incorporated by reference. One having ordinary skill in the art will readily understand that the present invention could be expanded to multiple-pole configurations by adding further bridges to create additional resonators. Further, although the device of 700 is shown as a resonant gate configuration, however, resonant channel filter configurations are also contemplated.

Thus, a number of preferred embodiments have been fully described above with reference to the drawing figures. Although the invention has been described based upon these preferred embodiments, it would be apparent to those of skilled in the art that certain modifications, variations, and alternative constructions would be apparent, while remaining within the spirit and scope of the invention.

The invention claimed is:

1. A resonant transistor comprising:
   a substrate;
   a source formed on said substrate;
   a drain formed on said substrate adjacent to said source, a gap being formed between said source and said drain;
   an input electrode formed on said substrate; and
   a carbon nanotube gate positioned over said gap and over said input electrode, said nanotube gate being clamped on one end by a contact electrode.

2. The resonant transistor of claim 1, wherein said contact electrode is formed on a dielectric layer formed on said substrate, and said nanotube gate is cantilevered over said gap and said input electrode.

3. The resonant transistor of claim 1, wherein a DC bias is applied to said nanotube gate via said contact electrode and an RF signal is applied between said input electrode and said nanotube gate.

4. The resonant transistor of claim 1, wherein said substrate comprises dielectric material.

5. The resonant transistor of claim 1, wherein said source and said drain are formed on a semiconductor layer formed on said substrate.

6. The resonant transistor of claim 1 wherein said transistor comprises a resonant gate field effect transistor.

7. The resonant transistor of claim 1 wherein said transistor comprises a resonant channel field effect transistor.

8. The resonant transistor of claim 1, wherein said carbon nanotube gate is configured to be mechanically displaced in response to a voltage applied to the input electrode.

9. The resonant transistor of claim 8, wherein said carbon nanotube gate is configured to mechanically vibrate in response to a time varying voltage applied to the input electrode.

10. The resonant transistor of claim 9, wherein said carbon nanotube gate is configured to mechanically resonate in response to a voltage applied to the input electrode at a predetermined frequency.

11. The resonant transistor of claim 10, wherein the predetermined frequency is greater than 100 MHz.

12. The resonant transistor of claim 11, wherein the predetermined frequency is in the range of 100 MHz to 100 GHz.

13. A resonant transistor comprising:
    a substrate;
    a source formed on said substrate;
    a drain formed on said substrate adjacent to said source, a gap being formed between said source and said drain;
    an input electrode formed on said substrate;
    first and second contact electrodes disposed at remote ends of an axis that intersects the pap and input electrode; and
    a carbon nanotube gate positioned over said gap and over said input electrode, said nanotube gate being clamped on first and second ends respectively by said first and second contact electrodes.

14. The resonant transistor of claim 13, wherein said first and second contact electrodes are formed on a dielectric layer formed on said substrate, and wherein said nanotube gate bridges said gap and said input electrode such that said source and said drain are on different sides of a longitudinal axis of said nanotube gate.

15. The resonant transistor of claim 13, wherein a DC bias is applied to said nanotube gate via said first and second contact electrodes and an RF signal is applied between said input electrode and said nanotube gate.

16. The resonant transistor of claim 13, wherein said substrate comprises dielectric material.

17. The resonant transistor of claim 13, wherein said source and said drain are formed on a semiconductor layer formed on said substrate.

18. The resonant transistor of claim 13 wherein said transistor comprises a resonant gate field effect transistor.

19. The resonant transistor of claim 13 wherein said transistor comprises a resonant channel field effect transistor.

20. The resonator transistor of claim 13, wherein said carbon nanotube gate is configured to be mechanically displaced in response to a voltage applied to the input electrode.

21. The resonator transistor of claim 20, wherein said carbon nanotube gate is configured to mechanically vibrate in response to a time varying voltage applied to the input electrode.

22. The resonant transistor of claim 21, wherein said carbon nanotube gate is configured to mechanically resonate in response to a voltage applied to the input electrode at a predetermined frequency.

23. The resonant transistor of claim 22, wherein the predetermined frequency is greater than 100 MHz.

24. The resonant transistor of claim 23, wherein the predetermined frequency is in the range of 100 MHz to 100 GHz.

25. A method of fabricating a resonant transistor, said method comprising steps of:
   forming a source and a drain on a substrate, said source and drain being adjacent to one another and being separated by a gap;
   forming an input electrode on said substrate;
   forming a contact electrode on said substrate;
   forming a carbon nanotube gate on said contact electrode such that said carbon nanotube gate is clamped on one end to said contact electrode and bridges said input electrode and said gap.

26. The method of claim 25, wherein said contact electrode is formed on a dielectric layer formed on said substrate, and said nanotube gate is cantilevered over said gap and said input electrode.

27. The method of claim 26, further comprising a step of forming a bridgepiece on said substrate and wherein said carbon nanotube gate contacts with said bridgepiece between said first and second ends.

28. The method of claim 25, further comprising a step of applying a DC bias to said nanotube gate via said contact electrode and a step of applying a RF signal between said input electrode and said nanotube gate.

29. The method of claim 25, wherein said substrate comprises dielectric material.

30. The method of claim 25, wherein said source and said drain are formed on a semiconductor layer formed on said substrate.

31. The method of claim 25, wherein said carbon nanotube gate is grown on a catalyst.

32. The method of claim 25, wherein said carbon nanotube gate is clamped on a second end.

* * * * *